United States Patent
Miyakura et al.

(10) Patent No.: US 12,435,439 B2
(45) Date of Patent: Oct. 7, 2025

(54) SUBSTRATE PROCESSING METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

(71) Applicant: Kokusai Electric Corporation, Tokyo (JP)

(72) Inventors: Takahiro Miyakura, Toyama (JP); Atsushi Moriya, Toyama (JP); Yasuhiro Megawa, Toyama (JP); Yasunobu Koshi, Toyama (JP); Akito Hirano, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 223 days.

(21) Appl. No.: 18/188,177

(22) Filed: Mar. 22, 2023

(65) Prior Publication Data

US 2023/0349065 A1 Nov. 2, 2023

(30) Foreign Application Priority Data

Apr. 28, 2022 (JP) .................................. 2022-074526
Mar. 15, 2023 (JP) .................................. 2023-041424

(51) Int. Cl.
*C30B 1/02* (2006.01)
*H01L 21/02* (2006.01)

(52) U.S. Cl.
CPC .............. *C30B 1/026* (2013.01); *C30B 1/023* (2013.01); *H01L 21/02524* (2013.01)

(58) Field of Classification Search
CPC .... C30B 1/023; C30B 1/026; H01L 21/02524
See application file for complete search history.

(56) References Cited

U.S. PATENT DOCUMENTS 6,362,044 B1 3/2002 Shimizu et al.
2008/0295887 A1* 12/2008 Moslehi ............... H01L 31/056
257/E27.125

(Continued)

FOREIGN PATENT DOCUMENTS

JP 2001-094067 A 4/2001
JP 2010-118462 A 5/2010

(Continued)

OTHER PUBLICATIONS

Taiwan Office Action issued on Nov. 23, 2023 for Taiwan Patent Application No. 112110032.

(Continued)

*Primary Examiner* — Robert M Kunemund
(74) *Attorney, Agent, or Firm* — Volpe Koenig

(57) ABSTRACT

There is provided a technique that includes: (a) forming a first film containing a Group 14 element on a substrate at a film-forming temperature; (b) performing a crystal growth of the first film by performing a heat treatment to the first film at a first temperature; and (c) moving the Group 14 element contained in at least part of the first film toward the substrate to crystallize the first film by performing the heat treatment to the first film at a second temperature higher than the first temperature.

20 Claims, 6 Drawing Sheets

(56) References Cited

U.S. PATENT DOCUMENTS

| | | | |
|---|---|---|---|
| 2009/0325366 A1* | 12/2009 | Moriya | H01L 21/02636 |
| | | | 118/725 |
| 2013/0344689 A1* | 12/2013 | Moriya | H01L 29/165 |
| | | | 118/712 |
| 2015/0349191 A1 | 12/2015 | Moriceau et al. | |
| 2016/0020093 A1* | 1/2016 | Van Aerde | H01L 21/02667 |
| | | | 438/486 |
| 2016/0126103 A1 | 5/2016 | Suzuki et al. | |
| 2016/0240618 A1 | 8/2016 | Chiba et al. | |
| 2017/0186604 A1* | 6/2017 | Orihashi | C23C 16/45523 |
| 2017/0253989 A1 | 9/2017 | Chiba et al. | |
| 2019/0206679 A1 | 7/2019 | Maeda et al. | |
| 2020/0083097 A1 | 3/2020 | Kitamura | |
| 2022/0415652 A1 | 12/2022 | Yamaguchi et al. | |

FOREIGN PATENT DOCUMENTS

| | | |
|---|---|---|
| JP | 2016-509364 A | 3/2016 |
| JP | 2016-092029 A | 5/2016 |
| JP | 2016-152351 A | 8/2016 |
| JP | 2017-162851 A | 9/2017 |
| JP | 2019-121620 A | 7/2019 |
| JP | 2020-043262 A | 3/2020 |
| TW | 201334067 A1 | 8/2013 |
| TW | 202137328 A1 | 10/2021 |

OTHER PUBLICATIONS

Japanese Office Action issued on Jul. 2, 2024 for Japanese Patent Application No. 2023-041424.
Japanese Office Action issued on 2023-041424 for Japanese Patent Application No. Mar. 26, 2024.

* cited by examiner

SUBSTRATE PROCESSING METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

CROSS-REFERENCE TO RELATED PATENT APPLICATION

This non-provisional U.S. patent application is based on and claims priority under 35 U.S.C. § 119 of Japanese Patent Application No. 2022-074526 filed on Apr. 28, 2022 and Japanese Patent Application No. 2023-041424 filed on Mar. 15, 2023, in the Japanese Patent Office, the entire contents of which are hereby incorporated by reference.

BACKGROUND

1. Field

The present disclosure relates to a substrate processing method, a method of manufacturing a semiconductor device, a non-transitory computer-readable recording medium and a substrate processing apparatus.

2. Related Art

According to some related arts, as a part of a manufacturing process of a semiconductor device, a process of forming a film on a substrate may be performed.

SUMMARY

According to one embodiment of the present disclosure, there is provided a technique that includes: (a) forming a first film containing a Group 14 element on a substrate at a film-forming temperature; (b) performing a crystal growth of the first film by performing a heat treatment to the first film at a first temperature; and (c) moving the Group 14 element contained in at least part of the first film toward the substrate to crystallize the first film by performing the heat treatment to the first film at a second temperature higher than the first temperature.

DETAILED DESCRIPTION

Embodiments of Present Disclosure

Figure 1:
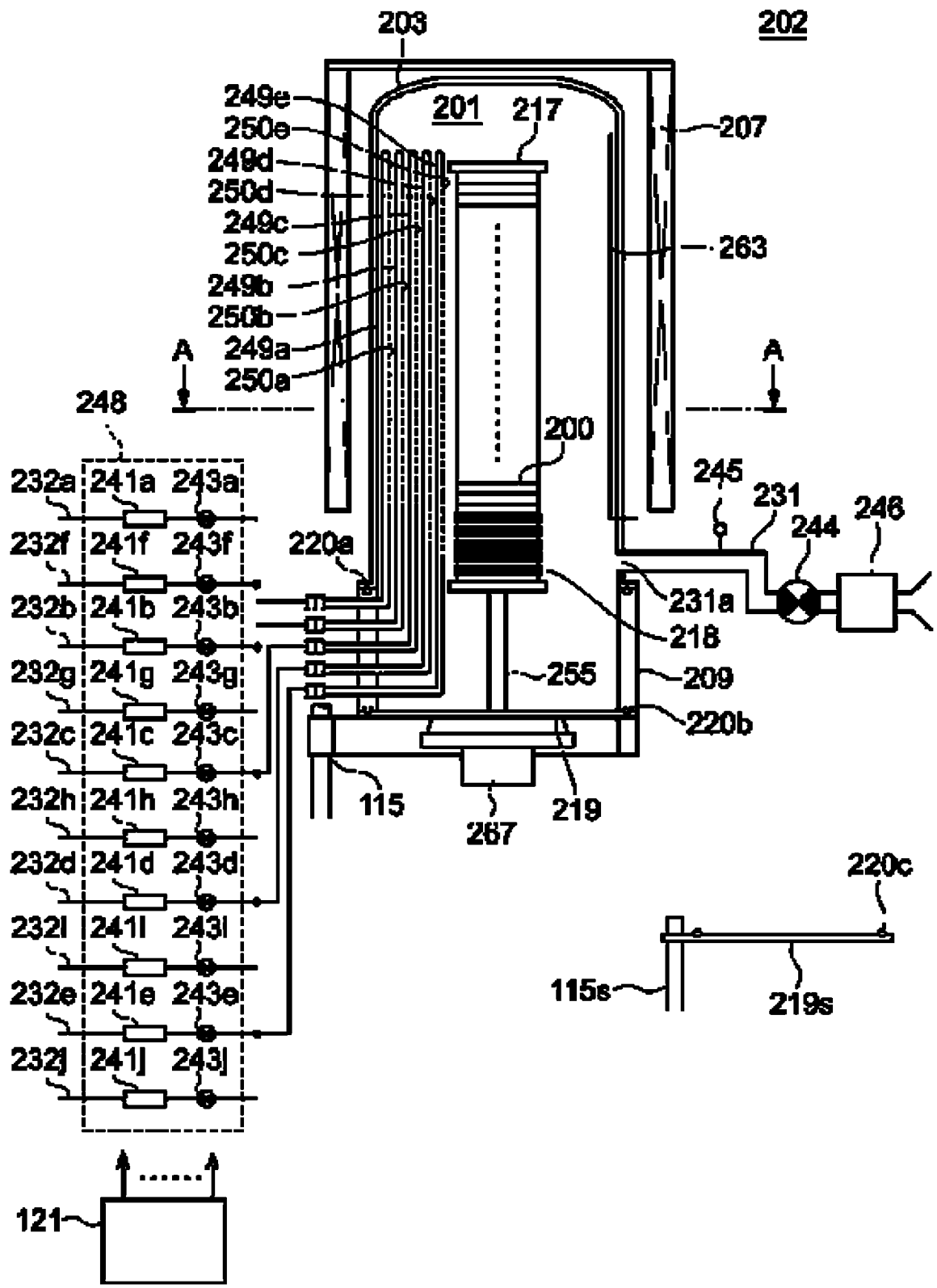
FIG. 1 is a diagram schematically illustrating a vertical cross-section of a vertical type process furnace 202 of a substrate processing apparatus according to one or more embodiments of the present disclosure.

Hereinafter, one or more embodiments (also simply referred to as "embodiments") of the technique of the present disclosure will be described in detail with reference to FIGS. 1 through 6. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

As shown in FIG. 1, a substrate processing apparatus according to the present embodiments includes a vertical type process furnace (also simply referred to as a "process furnace") 202. The process furnace 202 includes a heater 207 serving as a temperature regulator (which is a temperature adjusting structure, a heating structure or a heating system). The heater 207 is of a cylindrical shape, and is vertically installed while being supported by a support plate (not shown). The heater 207 also functions as an activator (also referred to as an "exciter") capable of activating (or exciting) a gas by a heat.

A reaction tube 203 is provided in an inner side of the heater 207 to be aligned in a manner concentric with the heater 207. For example, the reaction tube 203 is made of a heat resistant material such as quartz ($SiO_2$) and silicon carbide (SiC). For example, the reaction tube 203 is of a cylindrical shape with a closed upper end and an open lower end. A manifold 209 is provided under the reaction tube 203 to be aligned in a manner concentric with the reaction tube 203. For example, the manifold 209 is made of a metal material such as stainless steel (SUS). For example, the manifold 209 is of a cylindrical shape with open upper and lower ends. An upper end portion of the manifold 209 is engaged with a lower end portion of the reaction tube 203 so as to support the reaction tube 203. An O-ring 220a serving as a seal is provided between the manifold 209 and the reaction tube 203. Similar to the heater 207, the reaction tube 203 is installed vertically. A process vessel (also referred to as a "reaction vessel") is constituted mainly by the reaction tube 203 and the manifold 209. A process chamber 201 is provided in a hollow cylindrical portion of the process vessel. The process chamber 201 is configured to be capable of accommodating a plurality of wafers including a wafer 200 serving as a substrate. Hereinafter, the plurality of wafers including the wafer 200 may also be simply referred to as "wafers 200". The wafer 200 is processed in the process chamber 201.

Nozzles 249a, 249b, 249c, 249d and 249e are provided in the process chamber 201 so as to penetrate a side wall of the manifold 209. The nozzle 249a serves as a first supplier (which is a first supply structure), the nozzle 249b serves as a second supplier (which is a second supply structure), the nozzle 249c serves as a third supplier (which is a third supply structure), the nozzle 249d serves as a fourth supplier (which is a fourth supply structure) and the nozzle 249e serves as a fifth supplier (which is a fifth supply structure). Gas supply pipes 232a, 232b, 232c, 232d and 232e are connected to the nozzles 249a, 249b, 249c, 249d and 249e, respectively. The nozzles 249a through 249e are different nozzles. The nozzles 249b and 249d are provided adjacent to the nozzle 249c such that the nozzle 249c is located between the nozzles 249b and 249d. The nozzle 249a is provided adjacent to the nozzle 249b such that the nozzle 249b is located between the nozzles 249a and 249c, and the nozzle 249e is provided adjacent to the nozzle 249d such that the nozzle 249d is located between the nozzles 249c and 249e.

Mass flow controllers (also simply referred to as "MFCs") 241a, 241b, 241c, 241d and 241e serving as flow rate controllers (flow rate control structures) and valves 243a, 243b, 243c, 243d and 243e serving as opening/closing valves are sequentially installed at the gas supply pipes 232a, 232b, 232c, 232d and 232e, respectively, in this order from upstream sides to downstream sides of the gas supply pipes 232a, 232b, 232c, 232d and 232e in a gas flow direction. Gas supply pipes 232f, 232g, 232h, 232i and 232j are connected to the gas supply pipes 232a, 232b, 232c, 232d and 232e, respectively, at downstream sides of the valve 243a, 243b, 243c, 243d and 243e of the gas supply pipes 232a, 232b, 232c, 232d and 232e. MFCs 241f, 241g, 241h, 241i and 241j and valves 243f, 243g, 243h, 243i and 243j are sequentially installed at the gas supply pipes 232f, 232g, 232h, 232i and 232j, respectively, in this order from upstream sides to downstream sides of the gas supply pipes 232f, 232g, 232h, 232i and 232j in the gas flow direction. For example, each of the gas supply pipes 232a, 232b, 232c, 232d and 232e is made of a metal material such as SUS. The same also applies to the gas supply pipes 232f, 232g, 232h, 232i and 232j.

Figure 2:
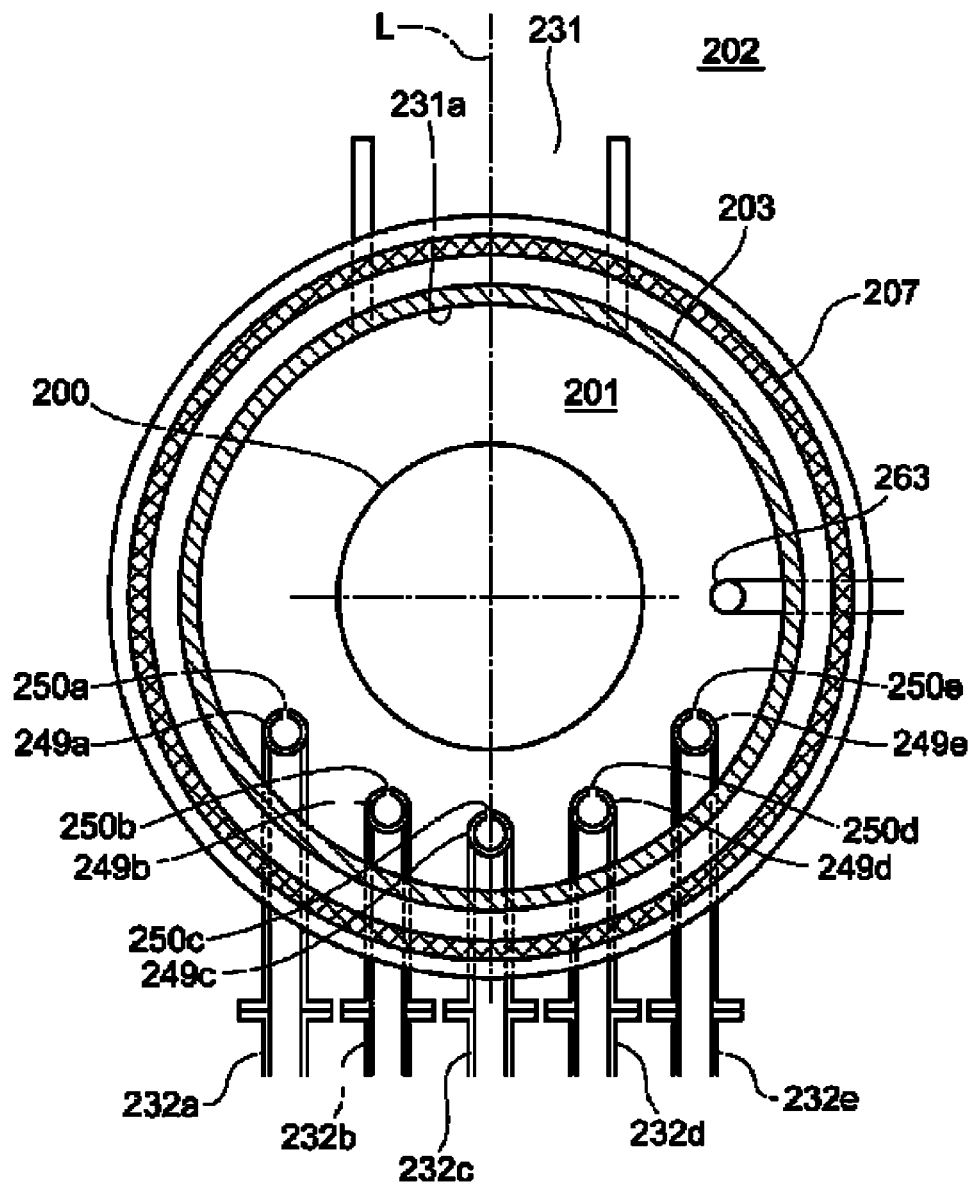
FIG. 2 is a diagram schematically illustrating a horizontal cross-section, taken along a line A-A shown in FIG. 1, of the vertical type process furnace 202 of the substrate processing apparatus according to the embodiments of the present disclosure.

As shown in FIG. 2, each of the nozzles 249a through 249e is installed in an annular space provided between an inner wall of the reaction tube 203 and the wafers 200 when viewed from above, and extends upward from a lower portion toward an upper portion of the reaction tube 203 along the inner wall of the reaction tube 203 (that is, extends upward along a wafer arrangement direction) (see FIG. 1). That is, each of the nozzles 249a through 249e is installed in a region that is located beside and horizontally surrounds a wafer arrangement region in which the wafers 200 are arranged (stacked) along the wafer arrangement region. When viewed from above, the nozzle 249c is arranged so as to face an exhaust port 231a described later along a straight line (denoted by "L" shown in FIG. 2) with a center of the wafer 200 transferred (loaded) into the process chamber 201 interposed therebetween. The nozzles 249b and 249d are arranged along the inner wall of the reaction tube 203 (that is, along an outer periphery of the wafer 200) such that the straight line L passing through the nozzle 249c and a center of the exhaust port 231a is interposed therebetween. Further, the nozzles 249a and 249e are arranged along the inner wall of the reaction tube 203 such that the straight line L is interposed therebetween. As described above, the nozzle 249a is provided adjacent to the nozzle 249b such that the nozzle 249b is located between the nozzles 249a and 249c, and the nozzle 249e is provided adjacent to the nozzle 249d such that the nozzle 249d is located between the nozzles 249c and 249e. The straight line L may also be referred to as a straight line passing through the nozzle 249c and the center of the wafer 200. That is, it can be said that the nozzle 249d is provided opposite to the nozzle 249b with the straight line L interposed therebetween. In addition, it can be said that the nozzle 249e is provided opposite to the nozzle 249a with the straight line L interposed therebetween. The nozzles 249b and 249d are arranged line-symmetrically with respect to the straight line L serving as an axis of symmetry. Similarly, the nozzles 249a and 249e are arranged line-symmetrically with respect to the straight line L serving as an axis of symmetry. A plurality of gas supply holes 250a, a plurality of gas supply holes 250b, a plurality of gas supply holes 250c, a plurality of gas supply holes 250d and a plurality of gas supply holes 250e are provided at side surfaces of the nozzles 249a, 249b, 249c, 249d, and 249e, respectively. Gases are supplied via the gas supply holes 250a through the gas supply holes 250e. The gas supply holes 250a through the gas supply holes 250e are open toward the exhaust port 231a, when viewed from above, and are configured such that the gases are supplied toward the wafers 200 via the gas supply holes 250a through the gas supply holes 250e. The gas supply holes 250a through the gas supply holes 250e are provided from the lower portion toward the upper portion of the reaction tube 203 (see FIG. 1).

A gas containing a Group 14 element (also referred to as a "Group 14 element-containing gas") serving as one of process gases is supplied into the process chamber 201 through the gas supply pipe 232a provided with the MFC 241a and the valve 243a and the nozzle 249a.

A dopant gas containing a Group 13 element or a Group 15 element (also simply referred to as a "dopant gas") is supplied into the process chamber 201 through the gas supply pipe 232b provided with the MFC 241b and the valve 243b and the nozzle 249b.

A reducing gas is supplied into the process chamber 201 through the gas supply pipe 232c provided with the MFC 241c and the valve 243c and the nozzle 249c.

A first halosilane-based gas (which is a silane-based gas) serving as one of the process gases is supplied into the process chamber 201 through the gas supply pipe 232d provided with the MFC 241d and the valve 243d and the nozzle 249d.

A second halosilane-based gas (which is another silane-based gas) serving as one of the process gases is supplied into the process chamber 201 through the gas supply pipe 232e provided with the MFC 241e and the valve 243e and the nozzle 249e.

An inert gas is supplied into the process chamber 201 via the gas supply pipes 232f through 232j provided with the MFCs 241f through 241j and the valves 243f through 243j, respectively, the gas supply pipes 232a through 232e and the nozzles 249a through 249e. The inert gas acts as a purge gas, a carrier gas, a dilution gas and the like.

A process gas supplier (which is a process gas supply structure or a process gas supply system) is constituted mainly by the gas supply pipes 232a, 232d and 232e, the MFCs 241a, 241d and 241e and the valves 243a, 243d and 243e. The process gas supplier may further include the gas supply pipe 232b, the MFC 241b and the valve 243b. Further, a reducing gas supplier (which is a reducing gas supply structure or a reducing gas supply system) is constituted mainly by the gas supply pipe 232c, the MFC 241c and the valve 243c. Further, an inert gas supplier (which is an inert gas supply structure or an inert gas supply system) is constituted mainly by the gas supply pipes 232f through 232j, the MFCs 241f through 241j and the valves 243f through 243j. In addition in the present specification, a structure constituted by the gas supply pipe 232a, the MFC 241a and the valve 243a may also be referred to as a "first gas supplier" (which is a first gas supply structure or a first gas supply system). The first gas supplier may further include the gas supply pipe 232f, the MFC 241f and the valve 243f. Similarly, a structure constituted mainly by the gas supply pipe 232b, the MFC 241b and the valve 243b may also be referred to as a "second gas supplier" (which is a second gas supply structure or a second gas supply system). The second gas supplier may further include the gas supply pipe 232g, the MFC 241g and the valve 243g. Similarly, a structure constituted mainly by the gas supply pipe 232c, the MFC 241c and the valve 243c may also be referred to as a "third gas supplier" (which is a third gas supply structure or a third gas supply system). The third gas supplier may further include the gas supply pipe 232h, the MFC 241h and the valve 243h. Similarly, a structure constituted mainly by the gas supply pipe 232d, the MFC 241d and the valve 243d may also be referred to as a "fourth gas supplier" (which is a fourth gas supply structure or a fourth gas supply system). The fourth gas supplier may further include the gas supply pipe 232i, the MFC 241i and the valve 243i. Similarly, a structure constituted mainly by the gas supply pipe 232e, the MFC 241e and the valve 243e may also be referred to as a "fifth gas supplier" (which is a fifth gas supply structure or a fifth gas supply system). The fifth gas supplier may further include the gas supply pipe 232j, the MFC 241j and the valve 243j.

Any one or an entirety of the gas suppliers described above may be embodied as an integrated gas supply system 248 in which the components such as the valves 243a through 243j and the MFCs 241a through 241j are integrated. The integrated gas supply system 248 is connected to the respective gas supply pipes 232a through 232j. An operation of the integrated gas supply system 248 to supply various gases to the gas supply pipes 232a through 232j, for example, operations such as an operation of opening and closing the valves 243a through 243j and an operation of adjusting flow rates of the gases through the MFCs 241a through 241j may be controlled by a controller 121 which will be described later. The integrated gas supply system 248 may be embodied as an integrated structure (integrated unit) of an all-in-one type or a divided type. The integrated gas supply system 248 may be attached to or detached from the components such as the gas supply pipes 232a through 232j on a basis of the integrated structure. Operations such as maintenance, replacement and addition for the integrated gas supply system 248 may be performed on a basis of the integrated structure.

As shown in FIG. 1, the exhaust port 231a through which an inner atmosphere of the process chamber 201 is exhausted is provided at a lower side wall of the reaction tube 203. As shown in FIG. 2, the exhaust port 231a is arranged at a location so as to face the nozzles 249a through 249e (the gas supply holes 250a through the gas supply hole 250e) with the wafer 200 interposed therebetween when viewed from above. The exhaust port 231a may be provided so as to extend upward from the lower portion toward the upper portion of the reaction tube 203 along a side wall of the reaction tube 203 (that is, along the wafer arrangement region). An exhaust pipe 231 is connected to the exhaust port 231a. As shown in FIG. 1, a vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (pressure detection structure) to detect an inner pressure of the process chamber 201, and the APC valve 244 serves as a pressure regulator (pressure adjusting structure). With the vacuum pump 246 in operation, the APC valve 244 may be opened or closed to perform a vacuum exhaust operation of the process chamber 201 or stop the vacuum exhaust operation. With the vacuum pump 246 in operation, the inner pressure of the process chamber 201 may be adjusted by adjusting an opening degree of the APC valve 244 based on pressure information detected by the pressure sensor 245. An exhauster (which is an exhaust structure or an exhaust system) is constituted mainly by the exhaust pipe 231, the APC valve 244 and the pressure sensor 245. The exhauster may further include the vacuum pump 246.

A seal cap 219 serving as a furnace opening lid capable of airtightly sealing (or closing) a lower end opening of the manifold 209 is provided under the manifold 209. For example, the seal cap 219 is made of a metal material such as SUS, and is of a disk shape. An O-ring 220b serving as a seal is provided on an upper surface of the seal cap 219 so as to be in contact with the lower end of the manifold 209. A rotator 267 configured to rotate a boat 217 described later is provided under the seal cap 219. A rotating shaft 255 of the rotator 267 is connected to the boat 217 through the seal cap 219. As the rotator 267 rotates the boat 217, the wafers 200 accommodated in the boat 217 are rotated. The seal cap 219 is elevated or lowered in the vertical direction by a boat elevator 115 serving as an elevating structure provided outside the reaction tube 203. The boat elevator 115 serves as a transfer device (which is a transfer structure or a transfer system) capable of transferring (loading) the boat 217 and the wafers 200 accommodated therein into the process chamber 201 and capable of transferring (unloading) the boat 217 and the wafers 200 accommodated therein out of the process chamber 201 by elevating and lowering the seal cap 219. A shutter 219s serving as a furnace opening lid capable of airtightly sealing (or closing) the lower end opening of the manifold 209 is provided under the manifold 209. The shutter 219s is configured to close the lower end opening of the manifold 209 when the seal cap 219 is lowered by the boat elevator 115 and the boat 217 is unloaded out of the process chamber 201. For example, the shutter 219s is made of a metal material such as SUS, and is of a disk shape. An O-ring 220c serving as a seal is provided on an upper surface of the shutter 219s so as to be in contact with the lower end of the manifold 209. An opening and closing operation of the shutter 219s such as an elevation operation and a rotation operation is controlled by a shutter opener/closer (which is a shutter opening/closing structure) 115s.

The boat 217 (which is a substrate support or a substrate retainer) is configured such that the wafers 200 (for example, 25 wafers to 200 wafers) are accommodated (or supported) in the vertical direction in the boat 217 while the wafers 200 are horizontally oriented with their centers aligned with one another with a predetermined interval therebetween in a multistage manner. For example, the boat 217 is made of a heat resistant material such as quartz and SiC. For example, a plurality of heat insulation plates 218 made of a heat resistant material such as quartz and SiC are supported at a lower portion of the boat 217 in a multistage manner.

A temperature sensor 263 serving as a temperature detector is installed in the reaction tube 203. A state of electric conduction to the heater 207 is adjusted based on temperature information detected by the temperature sensor 263 such that a desired temperature distribution of an inner temperature of the process chamber 201 can be obtained. The temperature sensor 263 is provided along the inner wall of the reaction tube 203.

Figure 3:
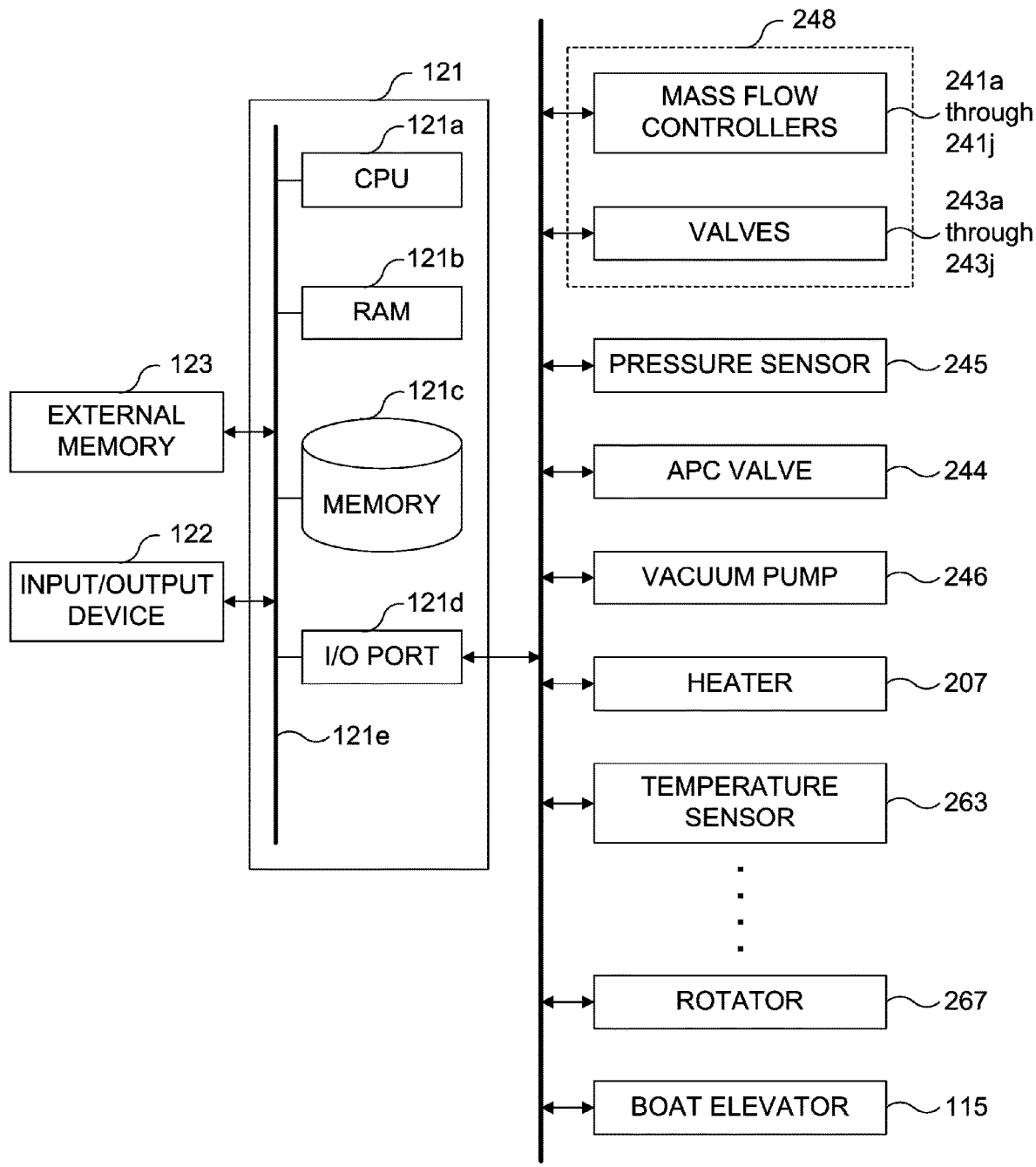
FIG. 3 is a block diagram schematically illustrating a configuration of a controller and related components of the substrate processing apparatus according to the embodiments of the present disclosure.

As shown in FIG. 3, the controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121*e*. For example, an input/output device 122 constituted by a component such as a touch panel is connected to the controller 121.

The memory 121*c* is configured by a component such as a flash memory, a hard disk drive (HDD) and a solid state drive (SSD). For example, a control program configured to control an operation of the substrate processing apparatus and a process recipe containing information on sequences and conditions of a substrate processing described later may be readably stored in the memory 121*c*. The process recipe is obtained by combining steps (sequences or processes) of the substrate processing described later such that the controller 121 can execute the steps to acquire a predetermined result, and functions as a program. Hereinafter, the process recipe and the control program may be collectively or individually referred to as a "program". In addition, the process recipe may also be simply referred to as a "recipe". Thus, in the present specification, the term "program" may refer to the recipe alone, may refer to the control program alone or may refer to both of the recipe and the control program. The RAM 121*b* functions as a memory area (work area) where a program or data read by the CPU 121*a* is temporarily stored.

The I/O port 121*d* is connected to the components described above such as the MFCs 241*a* through 241*j*, the valves 243*a* through 243*j*, the pressure sensor 245, the APC valve 244, the vacuum pump 246, the temperature sensor 263, the heater 207, the rotator 267, the boat elevator 115 and the shutter opener/closer 115*s*.

The CPU 121*a* is configured to read the control program from the memory 121*c* and execute the read control program. In addition, the CPU 121*a* is configured to read the recipe from the memory 121*c*, for example, in accordance with an operation command inputted from the input/output device 122. In accordance with the contents of the read recipe, the CPU 121*a* may be configured to be capable of controlling various operations such as flow rate adjusting operations for various gases by the MFCs 241*a* through 241*j*, opening and closing operations of the valves 243*a* through 243*j*, an opening and closing operation of the APC valve 244, a pressure regulating operation (pressure adjusting operation) by the APC valve 244 based on the pressure sensor 245, a start and stop operation of the vacuum pump 246, a temperature adjusting operation by the heater 207 based on the temperature sensor 263, an operation of adjusting the rotation and the rotation speed of the boat 217 by the rotator 267, an elevating and lowering operation of the boat 217 by the boat elevator 115 and an opening and closing operation of the shutter 219*s* by the shutter opener/closer 115*s*.

The controller 121 may be embodied by installing the above-described program stored in an external memory 123 into the computer. For example, the external memory 123 may include a magnetic disk such as a hard disk drive (HDD), an optical disk such as a CD, a magneto-optical disk such as an MO and a semiconductor memory such as a USB memory and a solid state drive (SSD). The memory 121*c* or the external memory 123 may be embodied by a non-transitory computer readable recording medium. Hereafter, the memory 121*c* and the external memory 123 may be collectively or individually referred to as a recording medium. Thus, in the present specification, the term "recording medium" may refer to the memory 121*c* alone, may refer to the external memory 123 alone or may refer to both of the memory 121*c* and the external memory 123. Instead of the external memory 123, a communication structure such as the Internet and a dedicated line may be used for providing the program to the computer.

(2) Substrate Processing

Figure 4:
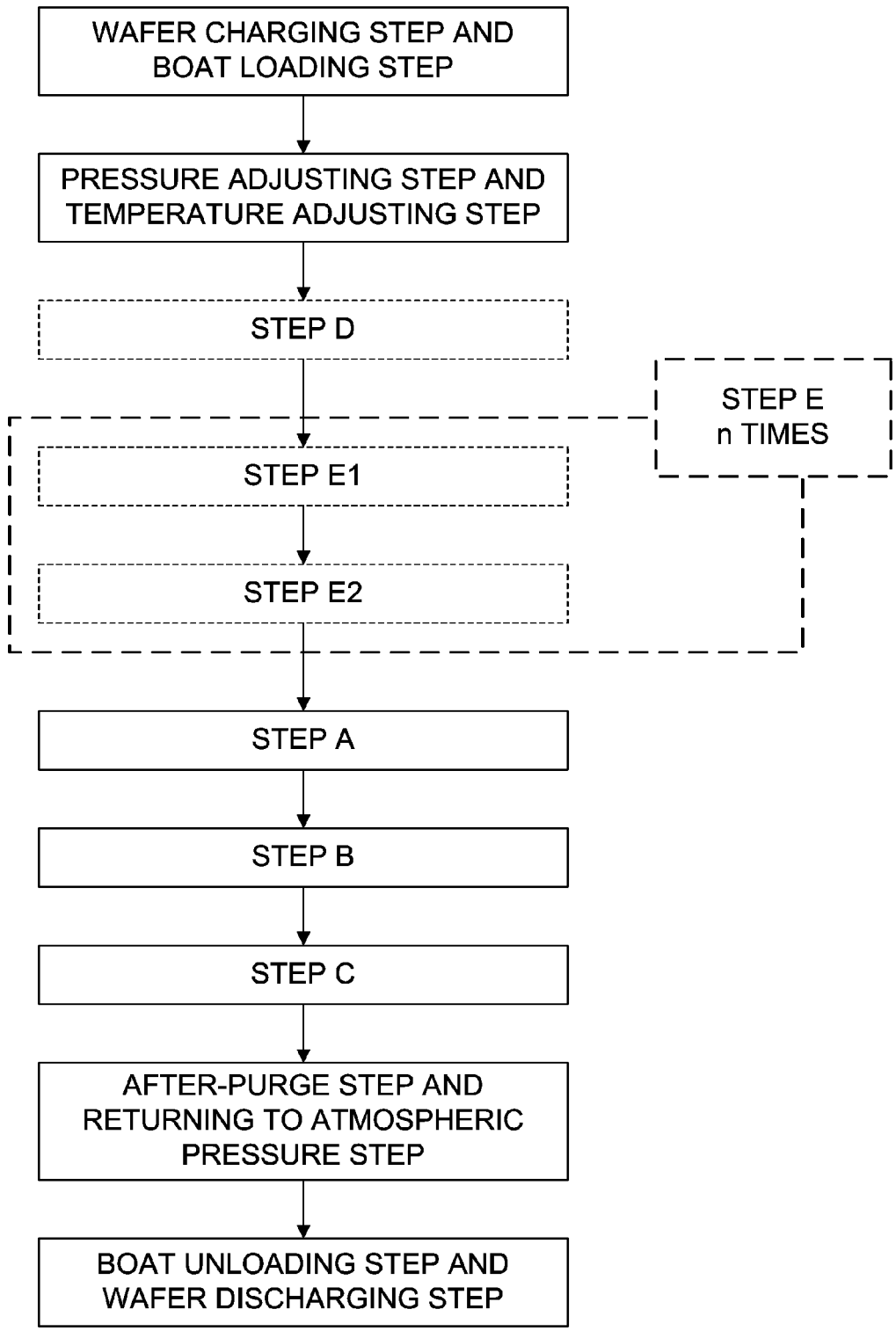
FIG. 4 is a flow chart schematically illustrating an exemplary flow of a substrate processing according to the embodiments of the present disclosure.

Hereinafter, an exemplary flow (exemplary process sequence) of the substrate processing such as a film-forming process of forming a film on the substrate (that is, the wafer 200) will be described mainly with reference to FIGS. 4, 5 and 6. The substrate processing serves as a part of a manufacturing process of a semiconductor device, and is performed by using the substrate processing apparatus described above. In the following descriptions, the operations of components constituting the substrate processing apparatus are controlled by the controller 121.

The substrate processing (that is, the manufacturing process of the semiconductor device) according to the present embodiments may include: (a) a step (also referred to as a "STEP A") of forming a first film containing a Group 14 element on the wafer 200 serving as the substrate; (b) a step (also referred to as a "STEP B") of performing a crystal growth of the first film by performing a heat treatment to the first film at a first temperature; and (c) a step (also referred to as a "STEP C") of moving (i.e., causing migration of) the Group 14 element contained in at least part of the first film toward the wafer 200 by performing the heat treatment to the first film at a second temperature higher than the first temperature.

The substrate processing may further include the following steps:

(d) a step (also referred to as a "STEP D") of forming a second film containing the Group 14 element on the wafer 200 before (a); and (e) a step (also referred to as a "STEP E") of forming a third film containing the Group 14 element on the wafer 200 before (a).

Figure 6:
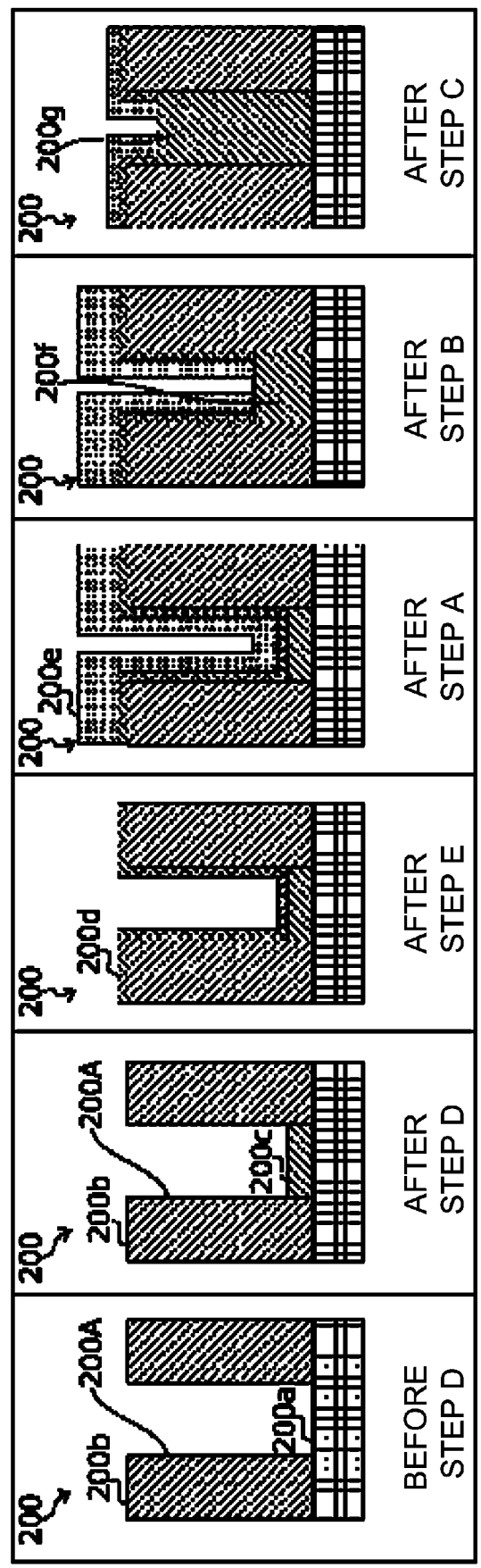
FIG. 6 is a diagram schematically illustrating exemplary states on a surface of a substrate according to the embodiments of the present disclosure.

Films formed in the steps described above are represented by reference numerals in FIG. 6, respectively. That is, the first film in (a) corresponds to a reference numeral 200*e*, the second film in (d) corresponds to a reference numeral 200*c*, the third film in (e) corresponds to a reference numeral 200*d*, the first film in (b) after performing the crystal growth corresponds to a reference numeral 200*f*, and the first film in (c) after moving (i.e., causing migration of) the Group 14 element contained in at least part of the first film toward the wafer 200 corresponds to a reference numeral 200*g*.

In the present specification, the term "wafer" may refer to "a wafer itself", or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", or may refer to "a surface of a predetermined layer (or a predetermined film) formed on a wafer". Thus, in the present specification, "forming a predetermined layer (or a film) on a wafer" may refer to "forming a predetermined layer (or a film) directly on a surface of a wafer itself", or may refer to "forming a predetermined layer (or a film) on a surface of another layer (or another film) formed on a wafer". In the present specification, the terms "substrate" and "wafer" may be used as substantially the same meaning.

<Wafer Charging Step and Boat Loading Step>

The wafers 200 are charged (transferred) into the boat 217 (wafer charging step). Then, the shutter 219*s* is moved by the shutter opener/closer 115*s* to open the lower end opening of the manifold 209 (shutter opening step). Thereafter, as shown in FIG. 1, the boat 217 supporting the wafers 200 is elevated by the boat elevator 115 and loaded (transferred)

into the process chamber 201 (boat loading step). With the boat 217 loaded, the seal cap 219 airtightly seals the lower end of the manifold 209 via the O-ring 220b.

<Pressure Adjusting Step and Temperature Adjusting Step>

Thereafter, the vacuum pump 246 vacuum-exhausts (decompresses and exhausts) the inner atmosphere of the process chamber 201 (that is, a space in which the wafers 200 are accommodated) such that the inner pressure of the process chamber 201 reaches and is maintained at a desired pressure (vacuum degree) (pressure adjusting step). When the vacuum pump 246 vacuum-exhausts the inner atmosphere of the process chamber 201, the inner pressure of the process chamber 201 is measured by the pressure sensor 245, and the APC valve 244 is feedback-controlled based on the pressure information detected by the pressure sensor 245. In addition, the heater 207 heats the process chamber 201 such that a temperature of the wafer 200 in the process chamber 201 reaches and is maintained at a desired film-forming temperature (temperature adjusting step). When the heater 207 heats the process chamber 201, the state of the electric conduction to the heater 207 is feedback-controlled based on the temperature information detected by the temperature sensor 263 such that a desired temperature distribution of the inner temperature of the process chamber 201 can be obtained. In addition, a rotation of the wafer 200 is started by the rotator 267. The vacuum pump 246 continuously vacuum-exhausts the inner atmosphere of the process chamber 201, the heater 207 continuously heats the wafer 200 in the process chamber 201 and the rotator 267 continuously rotates the wafer 200 until at least a processing of the wafer 200 is completed.

<First Film Forming Step: STEP A>

In the present step, the Group 14 element-containing gas is supplied to the wafer 200 in the process chamber 201 through the nozzle 249a, and the inert gas is supplied to the wafer 200 in the process chamber 201 through each of the nozzles 249b through 249e.

Specifically, the valve 243a is opened such that the Group 14 element-containing gas is supplied into the gas supply pipe 232a. A flow rate of the Group 14 element-containing gas supplied into the gas supply pipe 232a is adjusted by the MFC 241a. Then, the Group 14 element-containing gas whose flow rate is adjusted is supplied into the process chamber 201 through the nozzle 249a, and is exhausted through the exhaust port 231a. In the present step, simultaneously with a supply of the Group 14 element-containing gas, the valves 243g through 243j may be opened such that the inert gas is supplied into the process chamber 201 through each of the nozzles 249b through 249e.

By supplying the Group 14 element-containing gas to the wafer 200 through the nozzle 249a under process conditions described later, it is possible to form the first film 200e (which contains the Group 14 element serving as a main element (primary element)) on a surface of the wafer 200, that is, on the wafer 200. In the present step, when the wafer 200 is made of a material containing the Group 14 element as a main constituent (primary constituent), the first film 200e is formed on the surface of the wafer 200 containing the Group 14 element as the main constituent.

For example, the process conditions of the STEP A are as follows:
A supply flow rate of the Group 14 element-containing gas: from 100 sccm to 3,000 sccm;
A supply flow rate of the inert gas (for each gas supply pipe): from 10 sccm to 5,000 sccm;
A process temperature (film-forming temperature): from 300° C. to 600° C., preferably from 400° C. to 550° C.; and
A process pressure: from 1 Pa to 1,000 Pa.

The process conditions described above are conditions for the Group 14 element-containing gas to be thermally decomposed in a case where the Group 14 element-containing gas alone exists in the process chamber 201, that is, conditions under which a CVD (Chemical Vapor Deposition) reaction occurs. That is, the process conditions described above are conditions under which an adsorption (deposition) of the Group 14 element onto the wafer 200 is not self-limited, that is, conditions under which the adsorption of the Group 14 element onto the wafer 200 is non-self-limited.

In the present specification, a notation of a numerical range such as "from 1 Pa to 1,000 Pa" means that a lower limit and an upper limit are included in the numerical range. Therefore, for example, a numerical range "1 Pa to 1,000 Pa" means a range equal to or higher than 1 Pa and equal to or less than 1,000 Pa. The same also applies to other numerical ranges described in the present specification. The process temperature refers to the temperature of the wafer 200, and the process pressure refers to the inner pressure of the process chamber 201. Further, when a supply flow rate of a gas is zero (0) sccm, it refers to a case where the gas is not supplied. The same also applies to the following descriptions.

For example, as the Group 14 element-containing gas, a silicon hydride gas such as monosilane ($SiH_4$, abbreviated as MS) gas, disilane ($Si_2H_6$, abbreviated as DS) gas, trisilane ($Si_3H_8$) gas, tetrasilane ($Si_4H_{10}$) gas, pentasilane ($Si_5H_{12}$) gas and hexasilane ($Si_6H_{14}$) gas or a germanium hydride gas such as germane ($GeH_4$) gas, digermane ($Ge_2H_6$) gas, trigermane ($Ge_3H_8$) gas, tetragermane ($Ge_4H_{10}$) gas, pentagermane ($Ge_5H_{12}$) gas and hexagermane ($Ge_6H_{14}$) gas may be used. That is, a gas containing the Group 14 element and a hydrogen element may be used as the Group 14 element-containing gas. It is preferable that a gas selected from the group consisting of the monosilane ($SiH_4$, abbreviated as MS) gas, the disilane ($Si_2H_6$, abbreviated as DS) gas, the trisilane ($Si_3H_8$) gas, the germane ($GeH_4$) gas, the digermane ($Ge_2H_6$) gas and the trigermane ($Ge_3H_8$) gas is used as the Group 14 element-containing gas. Since the gases in the group described above may undergo a chemical reaction (or decompose) relatively easily, it is possible to improve a film-forming rate. Further, as the Group 14 element-containing gas, one or more of the gases exemplified above may be used. For example, both of a gas containing silicon (Si) and a gas containing germanium (Ge) may be used as the Group 14 element-containing gas. By using both of the gas containing silicon and the gas containing germanium as the Group 14 element-containing gas, it is possible to form a film containing silicon and germanium as the first film.

The STEP A may be performed under conditions that enable a crystal growth of at least part of the first film. For example, the STEP A may be performed under the following conditions.

First condition: the film (that is, the first film) is formed in a state where a highly crystalline structure (that is, a monocrystalline structure (single crystal structure)) is present on the surface of the wafer 200.

Second condition: the film containing silicon and germanium is formed as the first film by using both of the gas containing silicon and the gas containing germanium as the Group 14 element-containing gas.

By performing the STEP A by using one or both of the first condition and the second condition, the crystal growth is enabled in at least part of the first film 200e in the STEP A. Further, by performing the STEP A under conditions where the crystal growth is enabled in at least part of the first film 200e (in particular, a bottom of a recess 200A which is a concave portion or a groove of the first film 200e or a portion of the first film 200e adjacent or close to the wafer 200), it is possible to promote the crystal growth generated in the STEP B performed after the STEP A. In addition, it is possible to obtain a crystal whose crystal orientation is substantially the same as that of a crystal exposed at the bottom of the recess 200A.

In the present specification, for example, the "crystal growth" that occurs in steps such as the STEP A and the STEP B described later may refer to a crystal growth from an amorphous state to a polycrystalline state or a monocrystalline state (single crystal state), may refer to an increase in a size of polycrystalline crystal grains, may refer to an epitaxial growth, may refer to a solid phase epitaxial growth based on a seed crystal. Further, the epitaxial growth that occurs during a film formation in steps in the present specification such as the STEP A, the STEP D described later and the STEP E described later may also be referred to as a "vapor phase epitaxial growth". In addition, although the seed crystal is preferably monocrystalline (that is, a single crystal), a plurality of seed crystals may be present. The monocrystalline structure may include a monocrystalline film (single crystal film), a monocrystalline substrate (single crystal substrate) and the like. In addition, in the present specification, the monocrystalline substrate may refer to a substrate used for manufacturing the semiconductor device, for example. Further, the monocrystalline film may refer to a film formed by performing the crystal growth on the monocrystalline substrate. Further, the monocrystalline characteristics of the monocrystalline film may be different from those of the monocrystalline substrate. Although it is preferable that a material of the first film 200e and a material of the monocrystalline structure (which is a base of the first film 200e) are the same, the material of the first film 200e and the material of the monocrystalline structure may be different from each other. That is, the epitaxial growth of the first film may be a homoepitaxial growth or a heteroepitaxial growth depending on the materials of the first film and the base.

Further, in the STEP A, in a case where the wafer 200 is constituted by the surface 200a and an insulating film 200b as shown in FIG. 6, the first film 200e is formed in the following manner. First, in a region adjacent (or close) to the surface 200a, the crystal growth progresses to form a portion of the first film 200e adjacent (or close) to the surface 200a. Second, in a region adjacent (or close) to the insulating film 200b, a film in the amorphous state or the polycrystalline state is formed to become another portion of the first film 200e adjacent (or close) to the insulating film 200b. Alternatively, a film in a mixed crystal state of the amorphous state and the polycrystalline state may also be formed to become the portion the first film 200e adjacent (or close) to the insulating film 200b. Alternatively, a laminated film of an amorphous layer and a polycrystalline layer may be formed to become the portion of the first film 200e adjacent (or close) to the insulating film 200b. A crystalline state (that is, an existence of the amorphous state or the polycrystalline state, or a forming state of a layer) may be adjusted by the process conditions. In addition, in a case where the wafer 200 is provided with the recess 200A as shown in FIG. 6 and a side wall (side surface) of the recess 200A is constituted by the insulating film 200b and the bottom of the recess 200A is of the monocrystalline structure, the first film 200e formed in the recess 200A is epitaxially grown from the bottom of the recess 200A. Further, an amorphous crystal, a polycrystal and a mixed crystal of the amorphous crystal and the polycrystal may grow from the side wall of the recess 200A. Therefore, a mixed crystal film in a mixed crystal state of the amorphous state, the polycrystalline state and the monocrystalline state may be generated at a location where the respective growths are combined, for example, on a center of the recess 200A. As compared with the vapor phase epitaxial growth, the epitaxial growth occurring from the bottom of the recess 200A enables to grow a crystal whose crystal orientation is substantially the same as that of the monocrystalline structure on the bottom of the recess 200A. Since a portion on a surface of the side wall (that is, the insulating film 200b) of the recess 200A is not subject to the crystal growth but becomes the amorphous state, the polycrystalline state or the mixed crystal state of the amorphous state and the polycrystalline state, it is possible to grow a crystal on the center of the recess 200A in a manner that its crystal orientation is substantially the same as that of the crystal exposed at the bottom of the recess 200A.

In the STEP A, in addition to the supply of the Group 14 element-containing gas, the gas containing the Group 13 element or the Group 15 element (also referred to as the "dopant gas") may also be supplied. That is, a dopant gas supply step described below may be performed. The dopant gas may be supplied simultaneously with the Group 14 element-containing gas, or may be supplied non-simultaneously with the Group 14 element-containing gas. In the present specification, "supplied non-simultaneously" means "supplied sequentially" or "supplied alternately".

For example, nitrogen ($N_2$) gas or a rare gas such as argon (Ar) gas, helium (He) gas, neon (Ne) gas and xenon (Xe) gas may be used as the inert gas. The same also applies to the steps described below.

<Dopant Gas Supply Step>

As described above, the dopant gas supply step may be performed in the STEP A. The dopant gas is supplied through the nozzle 249b. Specifically, the valve 243b is opened such that the dopant gas is supplied into the gas supply pipe 232b. A flow rate of the dopant gas supplied into the gas supply pipe 232b is adjusted by the MFC 241b. Then, the dopant gas whose flow rate is adjusted is supplied into the process chamber 201 through the nozzle 249b, and is exhausted through the exhaust port 231a. In the present step, simultaneously with a supply of the dopant gas, the valves 243f, 243h, 243i and 243j may be opened such that the inert gas is supplied into the process chamber 201 through each of the nozzles 249a, 249c, 249d and 249e.

By supplying the dopant gas to the wafer 200, it is possible to form the first film (which contains the Group 13 element or the Group 15 element) 200e on the wafer 200.

For example, process conditions when supplying the dopant gas are as follows:

A supply flow rate of the dopant gas: from 10 sccm to 400 sccm;

A supply flow rate of the inert gas (for each gas supply pipe): from 10 sccm to 5,000 sccm;

The process temperature (film-forming temperature): from 300° C. to 600° C., preferably from 400° C. to 550° C.; and A process pressure: from 0.1 Pa to 1,000 Pa.

As described above, the dopant gas is the gas containing the Group 13 element or the Group 15 element. For example, the Group 13 includes boron (B), aluminum (Al), gallium (Ga) and indium (In). For example, the Group 15 includes phosphorus (P) and arsenic (As). Specifically, as the gas containing the Group 13 element, a borane-based gas (also referred to as a "borohydride-based gas") such as monoborane ($BH_3$) gas, diborane ($B_2H_6$) gas and triborane ($B_3H_8$) gas may be used. Further, as the gas containing the Group 13 element, a boron halide gas such as trichloroborane ($BCl_3$) gas may also be used. Further, as the gas containing the Group 13 element, a halide such as aluminum chloride ($AlCl_3$) gas, gallium chloride ($GaCl_3$) gas and indium chloride ($InCl_3$) gas may also be used. Further, for example, as the dopant gas containing the Group 15 element, a phosphine-based gas such as phosphine ($PH_3$) gas and diphosphine ($P_2H_6$) gas or a halogenated phosphorus gas such as phosphorus trichloride ($PCl_3$) gas may be used.

<Performing Crystal Growth of First Film: STEP B>

Subsequently, the step of performing the crystal growth of the first film 200e by heating the first film 200e at the first temperature is performed.

After the STEP A is completed, an output to the heater 207 is adjusted such that the inner temperature of the process chamber 201 is changed to the first temperature higher than the film-forming temperature described above. When performing the present step, the valves 243f through 243j are opened such that the inert gas is supplied into the process chamber 201 via the nozzles 249a through 249e to purge an inside of the process chamber 201. When the inner temperature of the process chamber 201 reaches the first temperature, the first film 200e is heat-treated (annealed) and crystallized. As a result, the first film 200f (which is crystal-grown) is formed. In the present step, in a case where the base of the first film 200e includes a configuration close to a monocrystal (single crystal), by processing the first film 200e under the following process conditions, the first film 200e is grown by the solid phase epitaxial growth according to the crystal of the base. The solid phase epitaxial growth occurs at least on the base of the first film 200e. Moreover, in the present step, most of the Group 14 elements contained in the first film 200e do not move toward the wafer 200.

For example, process conditions in the STEP B are as follows:

A supply flow rate of the inert gas (for each gas supply pipe): from 10 sccm to 5,000 sccm;

A process temperature (first temperature): equal to or higher than 500° C.; and

A process pressure: from 0.1 Pa to an atmospheric pressure.

Further, the first temperature is lower than the second temperature described later.

In the present step, the reducing gas may also be supplied to the wafer 200. As the reducing gas, for example, a gas containing hydrogen is used. Specifically, as the reducing gas, hydrogen ($H_2$) gas, deuterium ($D_2$) gas, activated hydrogen gas or a combination thereof may be used. As the reducing gas, it is preferable to use a gas containing hydrogen alone.

Specifically, the valve 243c is opened such that the reducing gas is supplied into the gas supply pipe 232c. A flow rate of the reducing gas supplied into the gas supply pipe 232c is adjusted by the MFC 241c. Then, the reducing gas whose flow rate is adjusted is supplied into the process chamber 201 through the nozzle 249c, and is exhausted through the exhaust port 231a. In the present step, simultaneously with a supply of the reducing gas, the valves 243f, 243g, 243i and 243j may be opened such that the inert gas is supplied into the process chamber 201 through each of the nozzles 249a, 249b, 249d and 249e.

Figure 5:
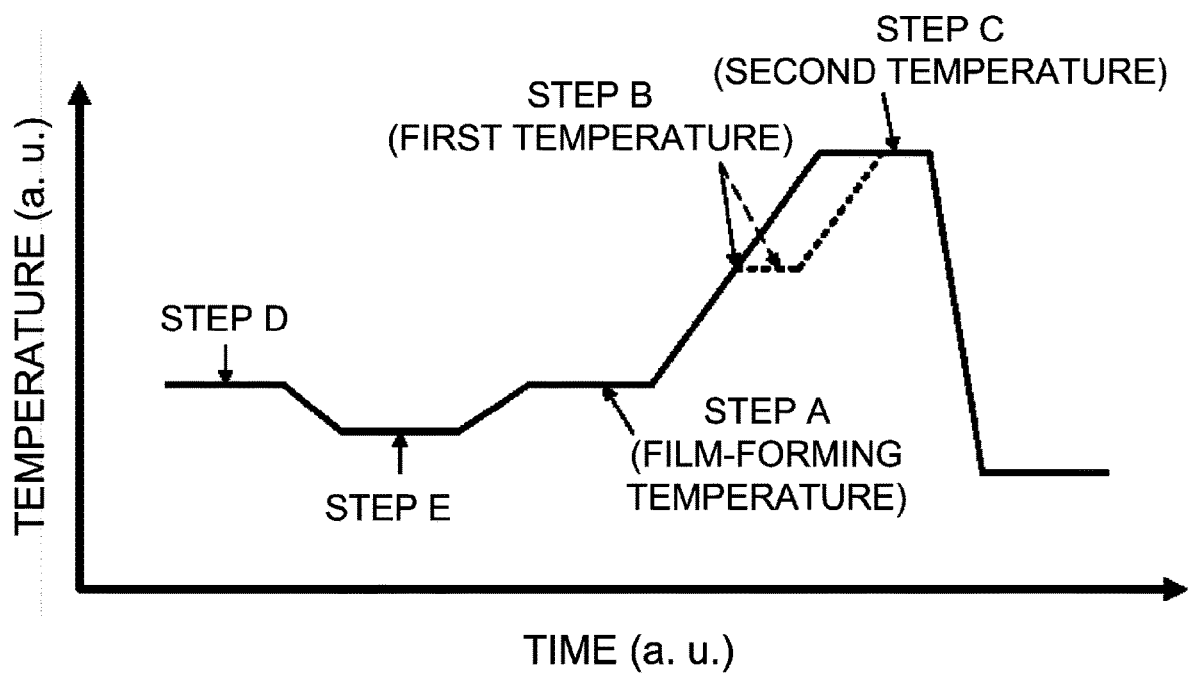
FIG. 5 is a diagram schematically illustrating a change in a temperature of the substrate processing according to the embodiments of the present disclosure.

In the STEP B, the heat treatment to the first film 200e may be performed while maintaining the inner temperature of the process chamber 201 at the first temperature (see a dotted line of a graph in FIG. 5). Alternatively, the heat treatment to the first film 200e may be performed without maintaining the inner temperature of the process chamber 201 at the first temperature. For example, by adjusting a temperature elevation rate such as a rate of elevating the temperature to the first temperature, the crystal growth of the first film 200e can be performed on at least part of the first film 200e at the first temperature (which is a temperature during an elevation process of elevating the inner temperature of the process chamber 201 from the film-forming temperature to the second temperature). In the present step, a migration of the Group 14 element rarely occurs during the crystal growth.

<Migration Step: STEP C>

After the STEP B, the STEP C is performed. In the STEP C, the output to the heater 207 is adjusted such that the inner temperature of the process chamber 201 is changed to the second temperature higher than the first temperature described above. When performing the present step, the valves 243f through 243j are opened such that the inert gas is supplied into the process chamber 201 through the nozzles 249a through 249e to purge the inside of the process chamber 201. When the inner temperature of the process chamber 201 reaches the second temperature, the Group 14 element contained in the first film 200e moves (migrates) toward the wafer 200. In the present specification, a movement of an element such as the Group 14 element may also be referred to as a "flow" or a "migration". Further, the movement of the Group 14 element occurs in a direction in which a thickness of the first film 200e is flattened. In a case where the wafer 200 is provided with a plurality of recesses including the recess 200A (hereinafter, the plurality of recesses including the recess 200A may also be referred to as "recesses 200A") and the first film 200e is formed on surfaces of the recesses 200A, the Group 14 element moves from upper portions to lower portions of the recesses 200A. As a result, as shown by "AFTER STEP C" in FIG. 6, the recess 200A (or the recesses 200A) can be filled with the first film 200g containing the Group 14 element. In the present specification, in the STEP C, a continuous film is formed from the bottom portions to the upper portions of the recesses 200A (that is, the first film is continuously crystallized from the bottom surfaces of the recesses 200A to the upper portions of the side surfaces of the recesses 200A). By performing the STEP B before the STEP C, it is possible to suppress an island-like crystal growth.

Further, in the present step, the reducing gas may also be supplied to the wafer 200. As the reducing gas, the gas exemplified above as the reducing gas may be used. Further, in the present step, the dopant gas may also be supplied to the wafer 200. As the dopant gas, the gas exemplified above as the dopant gas may be used.

For example, process conditions in the STEP C are as follows:

A supply flow rate of the inert gas (for each gas supply pipe): from 10 sccm to 5,000 sccm;

A process temperature (second temperature): equal to or higher than 600° C., preferably, a temperature higher than the first temperature; and A process pressure: from 0.1 Pa to 10,000 Pa.

<After-Purge Step and Returning to Atmospheric Pressure Step>

After the STEP C is completed, the $N_2$ gas serving as the purge gas is supplied into the process chamber 201 through each of the nozzles 249a, 249b and 249c, and then is exhausted through the exhaust port 231a. Thereby, the inner atmosphere of the process chamber 201 is purged with the purge gas. As a result, a residual gas in the process chamber 201 or reaction by-products remaining in the process chamber 201 are removed from the process chamber 201 (after-purge step). Thereafter, the inner atmosphere of the process chamber 201 is replaced with the inert gas (substitution by inert gas), and the inner pressure of the process chamber 201 is returned to the normal pressure (atmospheric pressure) (returning to atmospheric pressure step). In addition, the output to the heater 207 is adjusted such that a temperature lowering process is performed to lower the temperature of the wafer 200. The temperature of the wafer 200 is adjusted to a temperature at which the wafer 200 can be taken out of the process chamber 201.

<Boat Unloading Step and Wafer Discharging Step>

Thereafter, the seal cap 219 is lowered by the boat elevator 115 and the lower end of the manifold 209 is opened. Then, the boat 217 with the processed wafers 200 supported therein is unloaded (transferred) out of the reaction tube 203 through the lower end of the manifold 209 (boat unloading step). After the boat 217 is unloaded, the shutter 219s is moved such that the lower end opening of the manifold 209 is sealed by the shutter 219s through the O-ring 220c (shutter closing step). The processed wafers 200 are discharged (transferred) from the boat 217 after the boat 217 is unloaded out of the reaction tube 203 (wafer discharging step).

In a manner described above, the substrate processing is performed. Subsequently, the STEP D and the STEP E which are additionally performed in the substrate processing described above will be described.

<Second Film Forming Step: STEP D>

The STEP D is the step of forming the second film 200c containing the Group 14 element on the surface 200a of the wafer 200. The STEP D is performed before the STEP A. That is, the second film 200c is formed before forming the first film 200e. For example, the second film 200c containing the Group 14 element may be a film containing silicon (Si), a film containing germanium (Ge) or a film containing silicon and germanium. The second film 200c is formed by supplying the Group 14 element-containing gas as described above. Preferably, the second film 200c is a film containing two types of the Group 14 elements. That is, the second film 200c is, preferably, the film containing silicon and germanium.

For example, process conditions of the STEP D are as follows:

A supply flow rate of the Group 14 element-containing gas: from 100 sccm to 3,000 sccm;

A supply flow rate of the inert gas (for each gas supply pipe): from 10 sccm to 5,000 sccm;

A process temperature (film-forming temperature): from 300° C. to 600° C., preferably from 400° C. to 550° C.; and A process pressure: from 1 Pa to 1,000 Pa.

It is preferable that the second film 200c is formed on the wafer 200 provided with the highly crystalline structure on the surface thereof. By forming the second film 200c on the highly crystalline structure, it is possible to promote the epitaxial growth at least on a portion of the second film 200c adjacent (or close) to a surface of the highly crystalline structure. In the present specification, for example, the highly crystalline structure may refer to the monocrystalline structure. The monocrystalline structure may refer to a film close to the monocrystal, the monocrystalline substrate and the like. Preferably, the monocrystalline structure contains the same element as the second film 200c. Specifically, the monocrystalline structure may refer to a film containing the Group 14 element as a main constituent, or may refer to the wafer 200 containing the Group 14 element as a main constituent. When the wafer 200 is provided with the recesses 200A, the highly crystalline structure is preferably provided at the bottoms of the recesses 200A. Further, the side wall of the recess 200A is not formed by the highly crystalline structure but is preferably formed by the insulating film 200b as shown in FIG. 6. In a manner described above, by providing two types of substances (materials) on the surface of the wafer 200, it is possible to selectively form the second film 200c. For example, the second film 200c is formed on the highly crystalline structure, and is not formed on a surface of the insulating film 200b. It is possible to selectively form the second film 200c by supplying an adsorption inhibitory gas before supplying a gas used when forming the second film 200c (that is, the Group 14 element-containing gas described above). In the present embodiments, by using a gas that is selectively adsorbed on the surface of the insulating film 200b as the adsorption inhibitory gas, it is possible to adsorb the adsorption inhibitory gas only on the surface of the insulating film 200b. For example, by supplying a gas containing halogen, it is possible to adsorb the halogen only on the surface of the insulating film 200b. The halogen can suppress an adsorption of the gas used when forming the second film 200c.

When the STEP D is performed, the first film 200e is formed on a surface (which is a surface containing the Group 14 element as a main constituent) of the second film 200c.

<Third Film Forming Step: STEP E>

Subsequently, the STEP E will be described. The STEP E is the step of forming the third film 200d containing the Group 14 element on the wafer 200. The STEP E is performed before the STEP A. Further, the STEP D may be performed before the STEP E is performed, or may not be performed before the STEP E is performed. For example, the third film 200d containing the Group 14 element may be the film containing silicon (Si), the film containing germanium (Ge) or the film containing silicon and germanium. The third film 200d is formed by using two types of Group 14 element-containing gases. One of the two types of Group 14 element-containing gases is a first halosilane-based gas and the other is a second halosilane-based gas. For example, the two types of gases are supplied in a sequential order a predetermined number of times. In the present specification, a formation sequence of the third film 200d described above may be represented, for simplicity's sake, as follows. The same may also apply to descriptions of modified examples described later.

(first halosilane-based gas→second halosilane-based gas)×n (n is an integer of 1 or more)

(first halosilane-based gas→silane-based gas)×n (n is an integer of 1 or more)

When performing the STEP E, in a case where the STEP D is performed in advance, the temperature is adjusted from a temperature of the STEP D to a process temperature of the STEP E. The temperature is adjusted by adjusting the output to the heater 207.

<First Halosilane-Based Gas Supply Step: STEP E1>

In the present step, the first halosilane-based gas is supplied to the wafer 200 in the process chamber 201 through the nozzle 249d, and the inert gas is supplied to the wafer 200 in the process chamber 201 through each of the nozzles 249a, 249b, 249c and 249e.

Specifically, the valve 243d is opened such that the first halosilane-based gas is supplied into the gas supply pipe 232d. A flow rate of the first halosilane-based gas supplied into the gas supply pipe 232d is adjusted by the MFC 241d. Then, the first halosilane-based gas whose flow rate is adjusted is supplied into the process chamber 201 through the nozzle 249d, and is exhausted through the exhaust port 231a. Thereby, the first halosilane-based gas is supplied to the wafer 200. In the present step, simultaneously with a supply of the first halosilane-based gas, the valves 243f, 243g, 243h and 243j are opened such that the inert gas is supplied into the process chamber 201 through each of the nozzles 249a, 249b, 249c and 249e.

By supplying the first halosilane-based gas to the wafer 200 under process conditions described later, it is possible to remove a substance such as a natural oxide film and impurities from the surface of the wafer 200 by a treatment action (etching action) of the first halosilane-based gas. It is also possible to clean the surface of the wafer 200.

After cleaning the surface of the wafer 200, the valve 243d is closed such that a supply of the first halosilane-based gas into the process chamber 201 is stopped. Then, the inner atmosphere of the process chamber 201 is vacuum-exhausted such that a residual gas in the process chamber 201 and reaction by-products remaining in the process chamber 201 are removed from the process chamber 201. When vacuum-exhausting the inner atmosphere of the process chamber 201, the valves 243f through 243j are opened such that the inert gas is supplied into the process chamber 201 via the nozzles 249a through 249e. The inert gas supplied via the nozzles 249a through 249e acts as a purge gas, and thereby, the inside of the process chamber 201 is purged (purge step).

As the first halosilane-based gas, for example, a chlorosilane-based gas such as dichlorosilane ($SiH_2Cl_2$, abbreviated as DCS) gas, monochlorosilane ($SiH_3Cl$, abbreviated as MCS) gas, tetrachlorosilane ($SiCl_4$, abbreviated as STC) gas, trichlorosilane ($SiHCl_3$, abbreviated as TCS) gas, hexachlorodisilane ($Si_2Cl_6$, abbreviated as HCDS) gas and octachlorotrisilane ($Si_3Cl_8$, abbreviated as OCTS) gas may be used. Further, as the first halosilane-based gas, for example, a gas such as tetrafluorosilane ($SiF_4$) gas, tetrabromosilane ($SiBr_4$) gas and tetraiodosilane ($SiI_4$) gas may be used. That is, as the first halosilane-based gas, for example, in addition to or instead of the chlorosilane-based gas, a halosilane-based gas such as a fluorosilane-based gas, a bromosilane-based gas and an iodosilane-based gas may be used.

<STEP E2>

After the STEP E1 is completed, the second halosilane-based gas (silane-based gas) is supplied to the wafer 200 in the process chamber 201 (that is, the cleaned surface of the wafer 200) through the nozzle 249e. The inert gas may also be supplied to the wafer 200 in the process chamber 201 through each of the nozzles 249a, 249b, 249c and 249d.

Specifically, the valve 243e is opened such that the second halosilane-based gas is supplied into the gas supply pipe 232e. A flow rate of the second halosilane-based gas supplied into the gas supply pipe 232e is adjusted by the MFC 241e. Then, the second halosilane-based gas whose flow rate is adjusted is supplied into the process chamber 201 through the nozzle 249e, and is exhausted through the exhaust port 231a. Thereby, the second halosilane-based gas is supplied to the wafer 200. In the present step, simultaneously with a supply of the second halosilane-based gas, the valves 243f, 243g, 243h and 243i may be opened such that the inert gas is supplied into the process chamber 201 through each of the nozzles 249a, 249b, 249c and 249d.

By supplying the second halosilane-based gas to the wafer 200 under process conditions described later, it is possible to adsorb silicon contained in the second halosilane-based gas onto the surface of the wafer 200 cleaned in the STEP E1 to form a seed (nucleus). Under the process conditions described later, a crystal structure of the nucleus formed on the surface of the wafer 200 varies depending on surface states in which the nucleus is formed. For example, the surface 200a of the wafer 200 is in a state including at least one among the monocrystalline state, the polycrystalline state or the amorphous state, and the surface of the wafer 200 adjacent (or close) to the insulating film 200b is in the amorphous state. Further, in a case where the surface 200a of the wafer 200 is the monocrystalline structure, the crystal structure of the nucleus may be a film containing the monocrystal. That is, in the STEP E, the third film 200d can be epitaxially grown on the surface 200a. In a case where the STEP D is performed before the STEP E is performed, the wafer 200 is in a state where the second film 200c is provided. Therefore, the STEP E is performed on the wafer 200 provided with the second film 200c. In such a case, in the STEP D, when the second film 200c is epitaxially grown, the third film 200d can be epitaxially grown on the second film 200c. Further, in a case where the wafer 200 is provided with the insulating film 200b, a portion of the third film 200d adjacent (or close) to the insulating film 200b is in the amorphous state, the polycrystalline state or the mixed crystal state of the amorphous state and the polycrystalline state.

After the nucleus is formed on the surface of the wafer 200, the valve 243e is closed such that a supply of the second halosilane-based gas into the process chamber 201 is stopped. Then, a residual gas in the process chamber 201 and reaction by-products remaining in the process chamber 201 are removed from the process chamber 201 by substantially the same process procedure as the purge step of the STEP E1.

As the second halosilane-based gas, the halosilane-based gas exemplified above for the first halosilane-based gas may be used. Preferably, the second halosilane-based gas is different from the first halosilane-based gas. Alternatively, a silane-based gas may be used instead of the second halosilane-based gas. For example, as the silane-based gas, the silicon hydride gas such as monosilane ($SiH_4$, abbreviated as MS) gas, disilane ($Si_2H_6$, abbreviated as DS) gas, trisilane ($Si_3H_8$) gas, tetrasilane ($Si_4H_{10}$) gas, pentasilane ($Si_5H_{12}$) gas and hexasilane ($Si_6H_{14}$) gas may be used.

For example, the process conditions of the STEP E1 are as follows:
A supply flow rate of the first halosilane-based gas: from 100 sccm to 1,000 sccm;
A supply flow rate of the inert gas (for each gas supply pipe): from 10 sccm to 5,000 sccm;
A process temperature: from 300° C. to 500° C., preferably lower than the film-forming temperature; and
A process pressure: from 2 Pa to 1,000 Pa.

For example, the process conditions of the STEP E2 are as follows:
A supply flow rate of the second halosilane-based gas or the silane-based gas: from 50 sccm to 1,000 sccm.
The other process conditions of the STEP E2 are substantially the same as the process conditions of the STEP E1.

By performing the STEP E1 and the STEP E2, it is possible to form the third film 200d on the wafer 200. In a case where the wafer 200 is provided with the recess 200A, the third film 200d is formed on the surface of the recess 200A. In the present specification, the third film 200d may also be referred to as a "seed layer". By performing the STEP E1 on the wafer 200 under the process conditions described above, it is possible to clean the surface of the wafer 200. By performing the STEP E2 on the wafer 200 cleaned by performing the STEP E1, it is possible to adsorb silicon contained in the second halosilane-based gas (silane-based gas) on the surface of the wafer 200 to form the seed (nucleus). Further, under such process conditions, the seed layer formed on the surface of the wafer 200 is monocrystalline or amorphous on the surface 200a of the wafer 200 and the seed layer is amorphous on the insulating film 200b.

For example, it is preferable to perform a cycle including the STEP E1 and the STEP E2 a predetermined number of times (at least once or more). By performing the cycle a plurality of times, it is possible to uniformly form the third film (seed layer) 200d on the surface of the wafer 200. In particular, in a case where a plurality of convex-concave portions are provided on the surface of the wafer 200, it is possible to uniformly form the third film (seed layer) 200d on the surface of the recess 200A. In addition, after the STEP E1 and after the STEP E2, the space in which the wafers 200 are accommodated (that is, the process chamber 201) may be exhausted, may be purged or may be exhausted and purged. Further, in the present step, the surface of the recess 200A may refer to the surface of the insulating film 200b, may refer to the surface 200a of the wafer 200 (or the surface of the second film 200c), or may refer to both of the surface of the insulating film 200b and the surface 200a of the wafer 200 (or the surface of the second film 200c).

In a case where the STEP E is performed, the temperature is adjusted to the film-forming temperature of the STEP A performed after the STEP E. The temperature is adjusted by adjusting the output to the heater 207.

Further, in a case where the STEP E is performed, the first film 200e is formed on a surface (which is a surface containing the Group 14 element as a main constituent) of the third film 200d.

(3) Effects According to Present Embodiments

According to the present embodiments, it is possible to obtain one or more of the following effects.

(a) By performing the STEP B after the STEP A, it is possible to perform the crystal growth on at least part of the first film 200e.

(b) By performing the STEP C after the STEP B, the crystal growth of the first film 200e can be suppressed from growing a plurality of island-like crystals, and the crystal growth of the first film 200e can be performed continuously.

However, in the following cases, since an island-like crystal growth of the first film 200e occurs, the crystal growth of the first film 200e cannot be performed continuously.

For example, a case where the STEP B and the STEP C are performed in parallel (that is, a case where the crystal growth and the movement (migration) of the Group 14 element are performed in parallel).

For example, a case where the STEP B is performed after the STEP C (that is, a case where the crystal growth is performed after the migration).

(c) In a case where the wafer 200 is provided with the recess 200A, by performing the STEP C after the STEP B, the crystal growth of the first film 200e formed in the recess 200A can be suppressed from growing the plurality of island-like crystals, and the crystal growth of the first film 200e can be performed continuously. Further, in the STEP B, since most of the Group 14 elements contained in the first film 200e formed in the recess 200A do not migrate, it is possible to perform the crystal growth on at least part of the first film 200e while the first film 200e is continuously provided from the lower portion to the upper portion of the recess 200A. It is also possible to fill the recess 200A with the film containing the Group 14 element. In addition, it is possible to suppress a formation of a void (seam) in the recess 200A.

However, in the following cases, since the island-like crystal growth of the first film 200e occurs, the crystal growth of the first film 200e cannot be performed continuously. Further, the void (seam) is formed in the recess 200A.

For example, the case where the STEP B and the STEP C are performed in parallel (that is, the case where the crystal growth and the movement (migration) of the Group 14 element are performed in parallel).

For example, the case where the STEP B is performed after the STEP C (that is, the case where the crystal growth is performed after the migration).

(d) By performing the STEP B during the temperature elevation to the second temperature in the STEP C, it is possible to shorten a substrate processing time. That is, it is possible to improve a process throughput.

(e) By supplying the reducing gas in the STEP C, it is possible to promote the movement of the Group 14 element.

(f) By forming the first film 200e doped with the element in the STEP A and supplying the dopant gas in the STEP C, it is possible to suppress a desorption of the element doped in the first film 200e from the first film 200e.

(g) By forming the second film 200c in the STEP D, it is possible to promote the crystal growth of the first film 200e in the STEP B. In addition, it is possible to suppress the island-like crystal growth. That is, the second film 200c acts as the seed crystal.

(h) By forming the second film 200c containing two types of the Group 14 elements in the STEP D, it is possible to lower a heat treatment temperature in the STEP B. In addition, it is possible to promote the crystal growth in the STEP A.

(i) By forming the second film 200c containing silicon and germanium in the STEP D, it is possible to lower the heat treatment temperature in the STEP B. In addition, it is possible to promote the crystal growth in the STEP A.

(j) By selectively forming the second film 200c on the bottom of the recess 200A on the surface of the wafer 200 in the STEP D, it is possible to preferentially form the film containing the Group 14 element in the recess 200A in the STEP A through the STEP C. That is, it is possible to improve filling characteristics in the recess 200A.

(k) By forming the seed layer serving as the third film 200d on the wafer 200 in the STEP E, it is possible to reduce a surface roughness of the first film 200e formed on the wafer 200.

(l) In a case where the wafer 200 is provided with the recess 200A, by forming the seed layer serving as the third film 200d on the wafer 200 in the STEP E, it is possible to reduce the surface roughness of the first film 200e formed on the wafer 200. It is also possible to improve the filling characteristics in the recess 200A.

(m) In a case where the base on which the first film is formed is the monocrystalline structure, it is possible to further promote the crystal growth. As a result, it is possible to achieve the epitaxial growth.

Other Embodiments (Modified Examples) of Present Disclosure

For example, the embodiments described above are described by way of an example in which the Group 14 element is silicon. However, the technique of the present disclosure is not limited thereto. For example, the technique of the present disclosure may also be applied when the Group 14 element is germanium. Even in such a case, it is possible to obtain one or more of the effects described above. In addition, the technique of the present disclosure may also be applied when both of silicon and germanium are used as the Group 14 elements. Even in such a case, it is possible to obtain one or more of the effects described above.

For example, the embodiments described above are described by way of an example in which a vertical batch type substrate processing apparatus configured to simultaneously process a plurality of substrates is used to perform the substrate processing for the film formation. However, the technique of the present disclosure is not limited thereto. For example, the technique of the present disclosure may be preferably applied when a single wafer type substrate processing apparatus configured to process one or several substrates at a time is used to perform the substrate processing for the film formation.

It is preferable that the process recipe (that is, a program defining parameters such as process sequences and the process conditions of the substrate processing) used to form the various films described above is prepared individually in accordance with the contents of the substrate processing such as a type of the film to be formed, a composition ratio of the film, a quality of the film, a thickness of the film, the process sequences and the process conditions of the substrate processing. That is, a plurality of process recipes are prepared. When starting the substrate processing, an appropriate process recipe is preferably selected among the process recipes in accordance with the contents of the substrate processing. Specifically, it is preferable that the process recipes prepared individually in accordance with the contents of the substrate processing are stored (installed) in the memory 121c of the substrate processing apparatus in advance via an electric communication line or the recording medium (for example, the external memory 123) storing the process recipes. Then, when starting the substrate processing, the CPU 121a of the substrate processing apparatus preferably selects the appropriate process recipe among the process recipes stored in the memory 121c of the substrate processing apparatus in accordance with the contents of the substrate processing. Thus, various films of different types, different composition ratios, different qualities and different thicknesses may be universally formed with a high reproducibility using a single substrate processing apparatus. In addition, since a burden on an operator such as inputting the process sequences and the process conditions may be reduced, various processes can be performed quickly while avoiding a malfunction of the apparatus.

The technique of the present disclosure may be implemented by changing an existing process recipe stored in the substrate processing apparatus to a new process recipe. When changing the existing process recipe to the new process recipe, the new process recipe may be installed in the substrate processing apparatus via the electric communication line or the recording medium storing the process recipes. Alternatively, the existing process recipe already stored in the substrate processing apparatus may be directly changed to the new process recipe according to the technique of the present disclosure by operating the input/output device of the substrate processing apparatus.

For example, the technique of the present disclosure may also be applied to a manufacturing process of a device of a three-dimensional structure such as a NAND flash memory, a DRAM and a logic device.

While the technique of the present disclosure is described in detail by way of the embodiments and the other embodiments (modified examples), the technique of the present disclosure is not limited thereto. The technique of the present disclosure may be modified in various ways without departing from the scope thereof. For example, the embodiments and the other embodiments (modified examples) may be combined appropriately.

According to some embodiments of the present disclosure, it is possible to improve the quality of the film formed on the substrate.

What is claimed is:

1. A substrate processing method comprising:
   (a) forming a first film containing a Group 14 element on a substrate at a film-forming temperature;
   (b) performing a crystal growth of the first film by performing a heat treatment to the first film at a first temperature; and
   (c) moving the Group 14 element contained in at least part of the first film toward the substrate to crystallize the first film by performing the heat treatment to the first film at a second temperature higher than the first temperature.

2. The method of claim 1, wherein (b) is performed during a temperature elevation from the first temperature to the second temperature.

3. The method of claim 1, wherein an insulating film is formed on a surface of the substrate, and a recess whose bottom surface includes the surface of the substrate is provided in the insulating film,
   wherein, in (a), the first film is formed on the bottom surface and a side surface of the recess and
   wherein, in (c), the Group 14 element contained in the first film is moved toward the bottom surface of the recess.

4. The method of claim 3, wherein, in (c), the first film is continuously crystallized from the bottom surface of the recess to an upper portion of the side surface of the recess.

5. The method of claim 1, wherein, in (a), the first film further containing a Group 13 element or a Group 15 element is formed by supplying a first gas containing the Group 14 element and a second gas containing the Group 13 element or the Group 15 element to the substrate.

6. The method of claim 5, wherein, in (c), the heat treatment is performed by supplying the second gas.

7. The method of claim 1, further comprising
   (d) forming a second film containing the Group 14 element on the substrate before (a).

8. The method of claim 7, wherein the second film contains the Group 14 element and another Group 14 element different from the Group 14 element.

9. The method of claim 7, wherein the substrate is provided with a recess on a surface thereof, a first surface whose main constituent is the Group 14 element is provided on a bottom surface of the recess, and a second surface constituted by an insulator is provided on a side surface of the recess.

10. The method of claim 9, wherein the second film is formed on the first surface.

11. The method of claim 1, wherein, in (a), the first film is formed on a surface of the substrate whose main constituent is the Group 14 element.

12. The method of claim 1, wherein, in (a), the first film in an amorphous state, a polycrystalline state or a mixed crystal state of the amorphous state and the polycrystalline state is formed.

13. The method of claim 1, wherein, in (b), the crystal growth of the first film comprises an epitaxial growth.

14. The method of claim 13, wherein the epitaxial growth comprises a solid phase epitaxial growth.

15. The method of claim 1, wherein (a) is performed under conditions that enable a crystal growth of at least part of the first film.

16. The method of claim 1, wherein, in (a), a crystal growth is enabled in at least part of the first film adjacent or close to the substrate.

17. The method of claim 16, wherein the substrate comprises a monocrystalline structure, and the first film is formed on the monocrystalline structure, wherein the substrate is provided with an insulating film, and wherein, in (a), the crystal growth is enabled in at least part of the first film adjacent or close to a surface of the monocrystalline structure, and at least part of the first film adjacent or close to a surface of the insulating film is in an amorphous state, a polycrystalline state or a mixed crystal state of the amorphous state and the polycrystalline state.

18. A method of manufacturing a semiconductor device on the substrate, comprising the method of claim 1.

19. A non-transitory computer-readable recording medium storing a program that causes a substrate processing apparatus, by a computer, to perform:
(a) forming a first film containing a Group 14 element on a substrate at a film-forming temperature;
(b) performing a crystal growth of the first film by performing a heat treatment to the first film at a first temperature; and
(c) moving the Group 14 element contained in at least part of the first film toward the substrate to crystallize the first film by performing the heat treatment to the first film at a second temperature higher than the first temperature after (b).

20. A substrate processing apparatus comprising:
a first supplier through which a Group 14 element-containing gas is supplied to a substrate;
a heater configured to heat the substrate; and
a controller configured to control the first supplier and the heater so as to perform:
(a) forming a first film containing a Group 14 element on the substrate at a film-forming temperature,
(b) performing a crystal growth of the first film by performing a heat treatment to the first film at a first temperature, and
(c) moving the Group 14 element contained in at least part of the first film toward the substrate to crystallize the first film by performing the heat treatment to the first film at a second temperature higher than the first temperature.

* * * * *